(12) United States Patent
Liu et al.

(10) Patent No.: US 9,544,695 B2
(45) Date of Patent: Jan. 10, 2017

(54) MEMS MICROPHONE DEVICE

(71) Applicant: SENSOR TEK Co., Ltd., Taipei (TW)

(72) Inventors: Mao-Chen Liu, Nantou County (TW);
Hao-Ming Chao, Taipei (TW);
Wen-Chieh Chou, Taoyuan (TW);
Po-Wei Lu, Taoyuan (TW); Shu-Yi Weng, Miaoli County (TW);
Chun-Chieh Wang, Taichung (TW)

(73) Assignee: SENSOR TEK CO., LTD., Taipei (TW)

( * ) Notice: Subject to any disclaimer, the term of this patent is extended or adjusted under 35 U.S.C. 154(b) by 176 days.

(21) Appl. No.: 14/620,961

(22) Filed: Feb. 12, 2015

(65) Prior Publication Data

US 2015/0245146 A1    Aug. 27, 2015

(30) Foreign Application Priority Data

Feb. 27, 2014  (TW) .............................. 103106819 A

(51) Int. Cl.
*H04R 17/02*     (2006.01)
*B81B 3/00*      (2006.01)

(52) U.S. Cl.
CPC ............. *H04R 17/02* (2013.01); *B81B 3/0051* (2013.01); *B81B 2201/0257* (2013.01); *B81B 2203/0127* (2013.01); *H04R 2201/003* (2013.01)

(58) Field of Classification Search
CPC ....... H04R 19/00; H04R 19/005; H04R 19/04; H04R 17/02; B81B 3/00; B81B 3/0051; B81B 2201/0257; B06B 1/0292

USPC .................................................. 257/416–419
See application file for complete search history.

(56) References Cited

U.S. PATENT DOCUMENTS

| | | | | |
|---|---|---|---|---|
| 7,834,409 | B2 * | 11/2010 | Reichenbach ...... | B81C 1/00182 257/419 |
| 2014/0264653 | A1 * | 9/2014 | Cheng ................ | B81C 1/00238 257/416 |
| 2016/0060104 | A1 * | 3/2016 | Chu .................... | B81C 1/00309 257/416 |

* cited by examiner

*Primary Examiner* — Monica D Harrison
(74) *Attorney, Agent, or Firm* — Muncy, Geissler, Olds & Lowe, P.C.

(57) ABSTRACT

A Micro-Electro-Mechanical-System (MEMS) microphone device includes a substrate, a MEMS microphone thin film, oxide layer. The substrate has a first penetrating portion. The MEMS microphone thin film is above the substrate and covered the first penetrating portion defining a first cavity. The MEMS microphone thin film includes an elastic portion and a connection portion. The elastic portion has a plurality of first slots arranged along the edge of the elastic portion and sequentially and separately. The first slots are penetrated two surface of the elastic portion, the surface are opposite each other. The connection portion is connected to the elastic portion and contacted the substrate. The oxide layer has a second penetrating portion. The oxide layer is on the MEMS microphone thin film and contacted the connection portion. A part of the MEMS microphone thin film is exposed through the second penetrating portion.

22 Claims, 8 Drawing Sheets

MEMS MICROPHONE DEVICE

CROSS-REFERENCE TO RELATED APPLICATIONS

This non-provisional application claims priority under 35 U.S.C. §119(a) on Patent Application No. 103106819 filed in Taiwan, R.O.C on Feb. 27, 2014, the entire contents of which are hereby incorporated by reference.

BACKGROUND

Technical Field

The present invention relates to a chemical sensing device, particularly to a chemical sensing device capable of calibrating.

Description of the Related Art

As the breakthrough of the manufacture process of Micro Electro Mechanical System (MEMS) and the miniaturization of the sensing circuit, the MEMS microphone fits the need of the compact size of the modern consumer electronics products, and gradually replaces the traditional electret condenser microphone, and becomes the essential component of the consumer electronics products.

Generally, in order to achieve the high sensitivity of the MEMS microphone thin film, the current MEMS microphone mostly adopts the structure of changing the supporting spring or the MEMS microphone thin film. Taking the structure of changing the supporting spring for example, the method directly controls the coefficient of elasticity of the supporting spring to control the displacement of the MEMS microphone, so that the high voice sensitivity is achieved. For the structure of changing the MEMS microphone thin film, the method directly creates several micro structures on the MEMS microphone thin film for achieving the high voice sensitivity.

Although the aforementioned methods can achieve the high voice sensitivity for the MEMS microphone, but the design is quite complicate. Therefore, there are still rooms for improvement on the design of the MEMS microphone.

SUMMARY

A Micro Electro Mechanical System (MEMS) microphone device illustrated in an embodiment of the present invention includes a substrate, a MEMS microphone thin film, and an oxide layer. The substrate has a first penetrating portion. The MEMS microphone thin film is above the substrate covering the first penetrating portion and defines a first cavity. The MEMS microphone thin film includes an elastic portion and a connection portion. The elastic portion is defined in the center area of the MEMS microphone thin film. The connection portion is defined in the edge area of the MEMS microphone thin film and partially connected with the elastic portion, a plurality of first slots surrounding the elastic portion defined between the connection portion and the elastic portion. The oxide layer has a second penetrating portion and is connected with the connection portion of the MEMS microphone thin film, the second penetrating portion exposing at least part of the MEMS microphone thin film.

In an embodiment, the substrate has at least one recess portion and the recess portion surrounds the first penetrating portion.

In an embodiment, the MEMS microphone device further includes a backplane layer. The backplane layer is on the oxide layer and has a plurality of gaps, wherein part of the MEMS microphone thin film is exposed by the plurality of gaps and the second penetrating portion.

In an embodiment, the MEMS microphone device further includes at least one blocker. The at least one blocker is in the second penetrating portion, between the MEMS microphone thin film and the backplane layer, and connected with the oxide layer.

In an embodiment, the MEMS microphone device further includes a passivation layer. The passivation layer is on the oxide layer, wherein part of the backplane layer is exposed by the oxide layer.

In an embodiment, there are a first distance between the MEMS microphone thin film and the substrate, a second distance between the MEMS microphone thin film and the blocker, a third distance between the blocker and the backplane layer, and a fourth distance between the backplane layer and the passivation layer, and the first distance, the second distance, the third distance and the fourth distance are not less than 0.01 micrometer (μm) and not greater than 0.1 μm.

In an embodiment, the length of each of the plurality of gaps of the backplane layer is 3 μm.

In an embodiment, there is a fifth distance between the MEMS microphone thin film and the backplane layer, and the fifth distance is not less than 1 and not greater than 3 μm.

In an embodiment, in a cross sectional plane parallel to an upper surface of the substrate and a lower surface of the substrate, an area of the recess portion is less than the area of the first penetrating portion.

In an embodiment, the thickness of the MEMS microphone thin film is less than 0.4 μm.

In an embodiment, the length and width of the MEMS microphone thin film is less than 350 μm.

In an embodiment, the ratio of the width of plurality of first slots to the width of the MEMS microphone thin film is at least less than 1:200.

In an embodiment, the shape of the MEMS microphone thin film is a circle or a rectangle.

In an embodiment, the elastic portion further has a plurality of second slots and a plurality of third slots, and the plurality of first slots surrounds the plurality of second slots and the plurality of third slots, and the plurality of second slots and the plurality of third slots are arranged interlacedly, and each of the plurality of second slots is close and parallel to each of the plurality of first slots respectively, and each of the plurality of third slots is between the two nearby second slots respectively, and the plurality of third slots are pairwisely symmetric and located in the diagonally opposite corners of the elastic portion.

In an embodiment, the shapes of the plurality of first slots, the plurality of second slots, and the plurality of third slots are straight strips.

BRIEF DESCRIPTION OF THE DRAWINGS

The present invention will become more fully understood from the detailed description given hereinbelow and the accompanying drawings, which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In the following embodiments, the same symbols represent the same or similar components.

Figure 1:
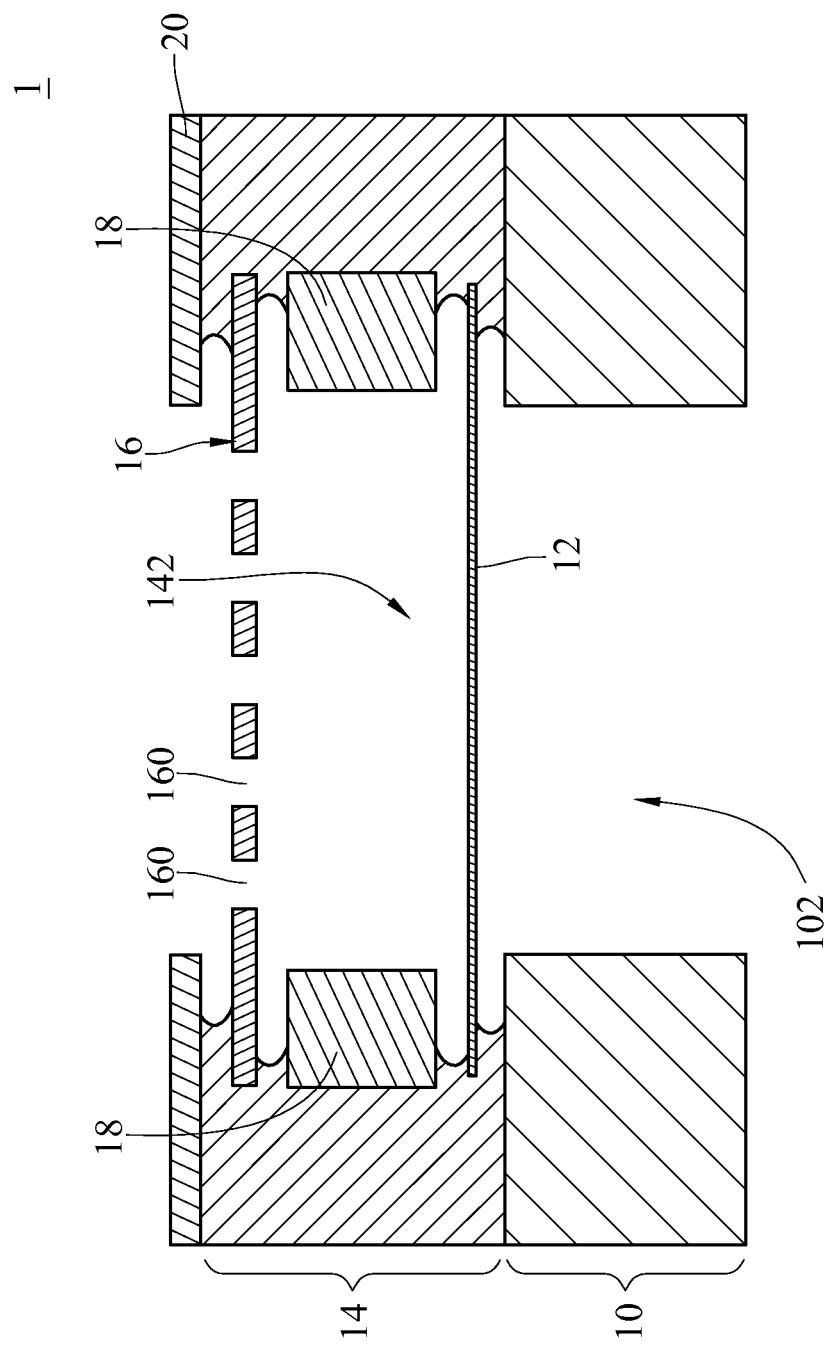
FIG. 1 is a cross sectional diagram of the MEMS microphone device according to an embodiment of the present invention.
Figure 2A:
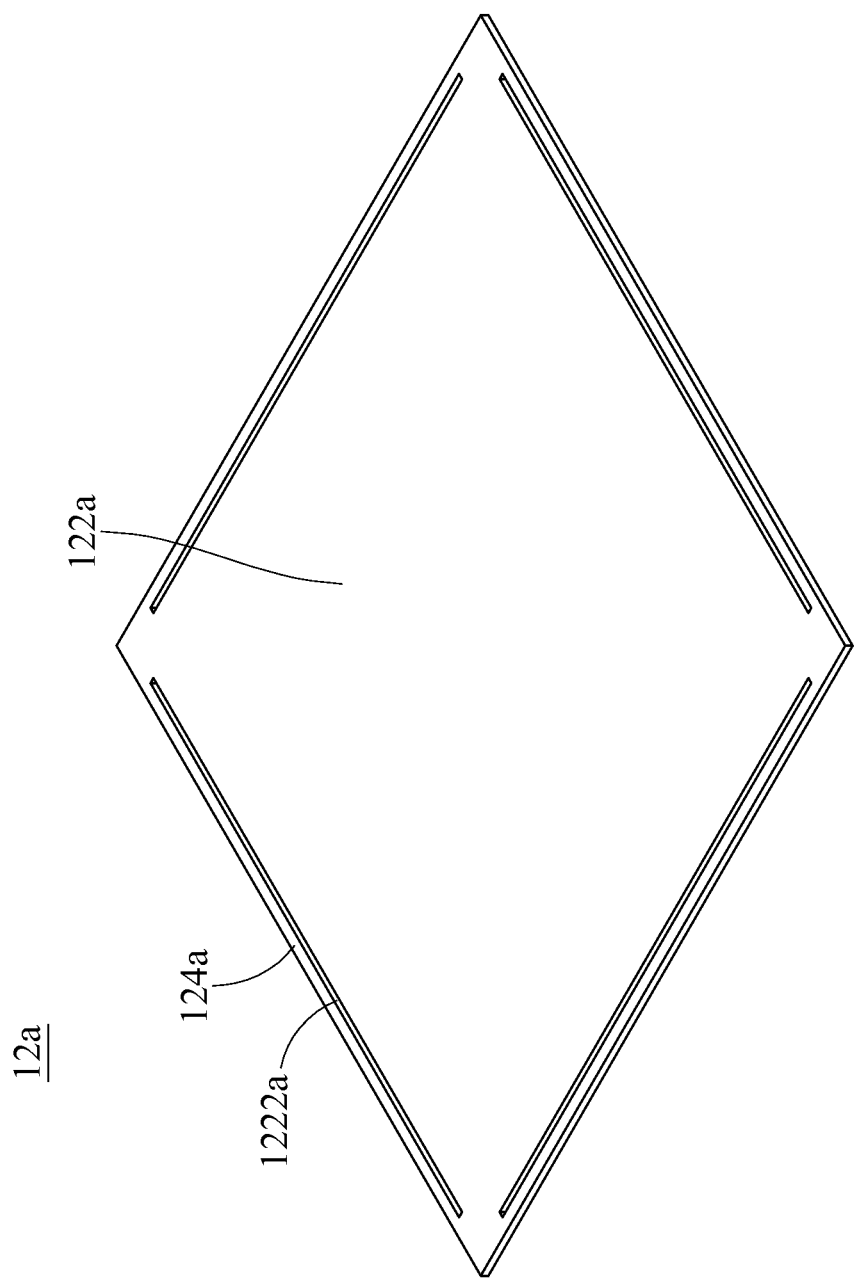
FIG. 2A is a 3D diagram of the MEMS microphone device according to an embodiment of the present invention.

Please refer to FIG. 1 and FIG. 2A. FIG. 1 is a cross sectional diagram of the Micro Electro Mechanical System (MEMS) microphone device according to an embodiment of the present invention. FIG. 2A is a 3D diagram of the MEMS microphone device according to an embodiment of the present invention. As shown in FIG. 1 and FIG. 2A, the MEMS microphone device 1 includes a substrate 10, a MEMS microphone thin film 12, an oxide layer 14, a backplane layer 16, a blocker 18, and a passivation layer 20. The MEMS microphone thin film 12 is shown as 12a in FIG. 2. In practice, the MEMS microphone device is manufactured by the standard CMOS process. The present embodiment is for illustrating but not for limiting the present invention.

The substrate 10 has a first penetrating portion 102. In the present embodiment, the first penetrating portion 102 is formed by the CMOS process and the CMOS process is, for example, wet etching. After the first penetrating portion 102 is formed, in the cross sectional diagram, the first penetrating portion 102 splits the substrate 10 into two parts, that is, the left part and the right part. In other words, the first penetrating portion 102 is approximately located in the center of the substrate. In addition, from the top view, the first penetrating portion 102 is but not limited to a circle, a rectangle, a polygon, or any other geometric shape. Besides, whether the first penetrating portion 102 splits the substrate 10 practically and forms two or more sub substrates is not limited by the embodiment. For example, from the top view, when the first penetrating portion 102 splits the substrate 10, the components located in the upper part of the substrate 10 of the MEMS microphone device 1 are available to be located on the plurality of sub substrates. In practice, the first penetrating portion 102 can be a hole on the substrate 10.

Taking the embodiment in FIG. 1 for example, the MEMS microphone thin film 12 is above the substrate 10 and in the oxide layer 14, and covers the first penetrating portion 102. Specifically, the MEMS microphone thin film 12 is made of an oxide layer, a poly-silicon layer, a contact layer, and a passivation layer by stacking the aforementioned layers. In an example of the MEMS microphone thin film 12, first, the oxide layer of the MEMS microphone thin film 12 is formed on the surface of the substrate 10. Next, the poly-silicon layer of the MEMS microphone thin film 12 is formed on the oxide layer. Next, the contact layer of the MEMS microphone thin film 12 is formed on the poly-silicon layer. Last, the passivation layer of the MEMS microphone thin film 12 is formed on the contact layer.

Taking the embodiment in FIG. 2A for example, the MEMS microphone thin film 12a includes an elastic portion 122a and a connection portion 124a. In practical operation, when the elastic portion 122a withstands the acoustic pressure, the elastic portion 122a vibrates up or down in a certain amount of displacement. The location of the MEMS microphone thin film 12 in the oxide layer 14 in the present embodiment is for illustrating but not for limiting in the present invention. For example, the MEMS microphone thin film 12a is also available to be located on the edge of the substrate 10 and the oxide layer 14, and contacts both the substrate 10 and the oxide layer 14.

Please refer to FIG. 2A continuously. The elastic portion 122a has a plurality of first slots 1222a and the plurality of first slots 1222a are arranged along the edge of the elastic portion 112a separately. Taking the MEMS microphone thin film 12a in a rectangular shape in FIG. 2A as an example, each of the plurality of first slots 1222a is close to the edge of the MEMS microphone thin film 12a and is in the inner side of the MEMS microphone thin film 12a. In an embodiment, the first slot 1222a penetrates through the two opposite sides of the elastic portion, wherein the two opposite sides are the upper surface and the lower surface. Comparing to the elastic portion 122a, the connection portion 124a is closer to the edge of the MEMS microphone thin film 12a. Generally, the connection portion 124a is defined between the edge of the MEMS microphone thin film 12a and the elastic portion 122a. Although the connection portion 124a is on the edge area of the MEMS microphone thin film 12a, the material of the connection portion 124a is the same as the material of the center of the MEMS microphone thin film 12a. The ratio of the width of the first slot 1222a to the width of the MEMS microphone thin film 12a is at least less than 1:200.

In addition, the connection portion 124a is for fixing the MEMS microphone thin film 12a on the oxide layer 14, so the connection portion 124a at least contacts the oxide layer 14. Certainly, as the disposition of the MEMS microphone thin film 12a changes, such as placing the MEMS microphone thin film 12a on the edge of the substrate 10 and the oxide layer 14, the connection portion 124a also possibly contacts the substrate 10 and the oxide layer 14 at the same time. In the present embodiment, the shape of the MEMS microphone thin film 12a is a rectangle and its material is poly-silicon. In addition, the thickness of the MEMS microphone thin film 12a is less than 0.4 μm, and both the length and width of the MEMS microphone thin film 12a are less than 350 μm. The width ratio of the first slot 1222a to the MEMS microphone thin film 12a is at least less than 1:200. The shape of the first slot 1222a is but not limited to a straight strip, T shape, C shape, zigzag shape, or any other possible shape. The embodiment is for illustrating but not for limiting the present invention.

By adding the first slot 1222a on the elastic portion 122a of the MEMS microphone thin film 12a, the MEMS microphone thin film 12a has more displacement amount. For example, when the MEMS microphone thin film 12a is under the acoustic pressure of 1 Pa, the displacement amount of the MEMS microphone thin film 12a is over 100 nm, and the yield stress of the MEMS microphone thin film 12 is approximately 100 Pa or less than 100 Pa. Therefore, the coefficient of elasticity of the MEMS microphone thin film 12a is controlled effectively and the firmness of the MEMS microphone thin film 12a is ensured, so that a high sensitivity for the voice variation is obtained.

Figure 2B:
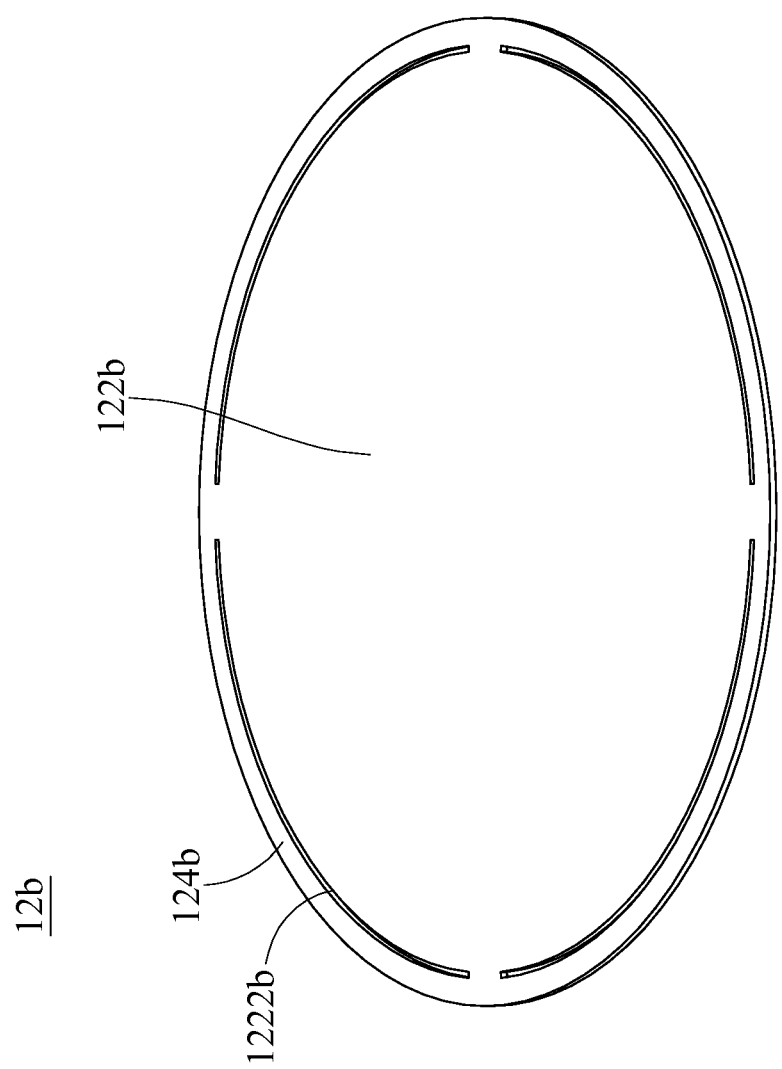
FIG. 2B is another 3D diagram of the MEMS microphone device according to an embodiment of the present invention.

The shape and the inner structure of the MEMS microphone thin film 12 in the embodiment are for illustrating but not for limiting the present invention. Other possible embodiments of the MEMS microphone thin film 12 are described as follows. Please refer to FIG. 2B. FIG. 2B is another 3D diagram of the MEMS microphone device according to an embodiment of the present invention. The MEMS microphone thin film 12b includes an elastic portion 122b and a connection portion 124b. The shape of the MEMS microphone thin film 12b is a circle, wherein the elastic portion 122b has a plurality of first slots 1222b, and the plurality of first slots 1222b are arranged along the edge of the elastic portion 112b sequentially and separately. The first slots 1222b penetrate through the two opposite sides of the elastic portion 122b. The number of the plurality of first slots 1222b is not limited in the present invention and is designed by persons skilled in the art. For example, the embodiment in FIG. 2B has four first slots 1222b. The shape of the first slots 1222b is but not limited to a T shape, C shape, zigzag shape, or any other possible shape. The embodiment is for illustrating but not for limiting the present invention.

Figure 2C:
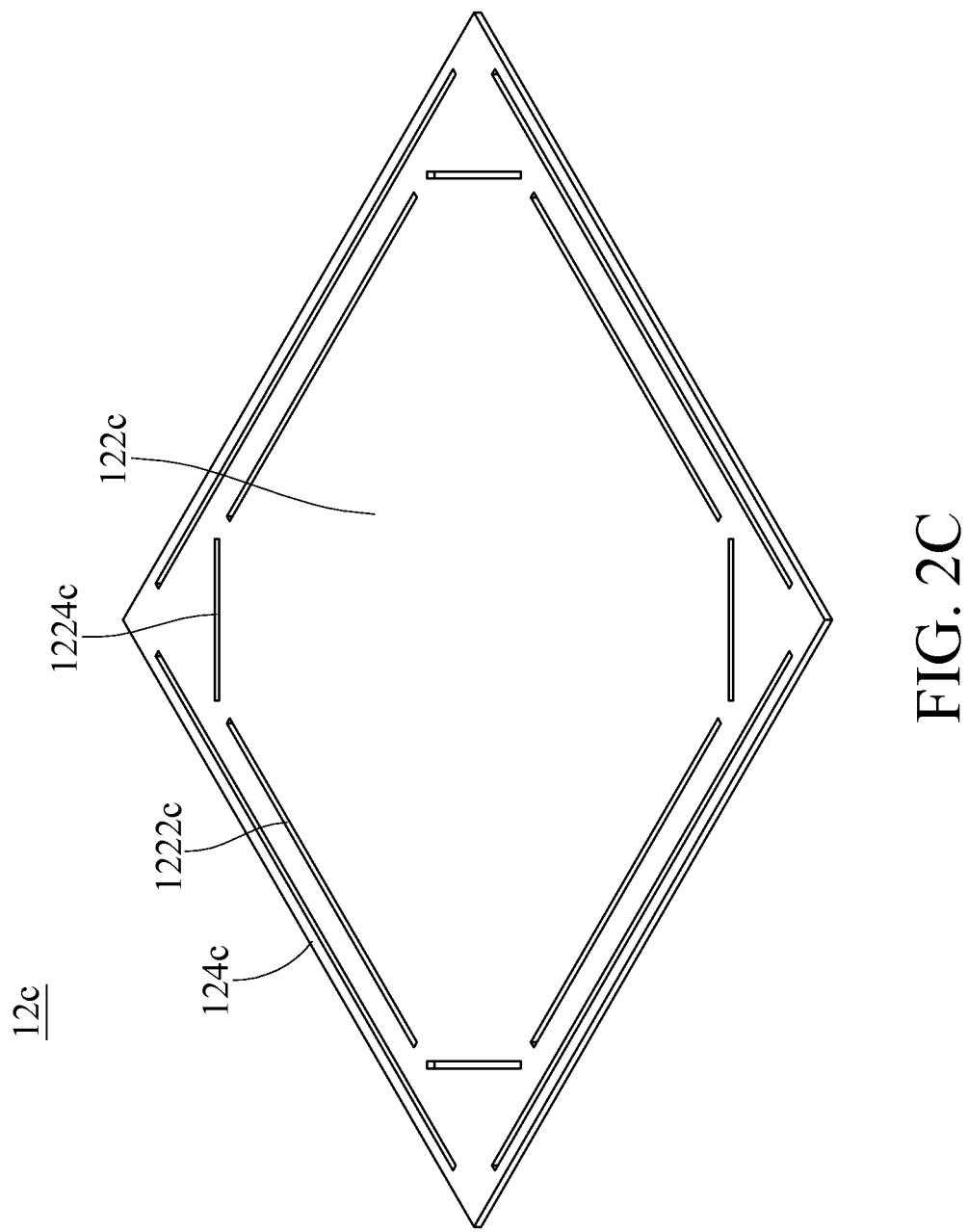
FIG. 2C is a further 3D diagram of the MEMS microphone device according to an embodiment of the present invention.

Please refer to FIG. 2C. FIG. 2C is a further 3D diagram of the MEMS microphone device according to an embodiment of the present invention. As shown in FIG. 2C, the MEMS microphone thin film 12c includes an elastic portion 122c and a connection portion 124c. The difference between the present embodiment and the previous embodiments is that the elastic portion 122c has more slots and the slots surround the elastic portion 122c with multiple layers. In the present embodiment, part of the slots parallel to the lateral edge of the MEMS microphone thin film 12c are the first slots 1222c, and part of the slots not parallel to any lateral edge of the MEMS microphone thin film 12c are the second slots 1224c. In practice, the first slots 1222c and the second slots 1224c are designed to be placed on the same layer in the multi-layer structure and are arranged interlacedly. Please be noted that although the second slots 1224c are in the inner circle of the multi-layer structure in the present embodiment, however, the second slots 1224c also can be designed to be placed in the outermost circle of the multi-layer structure and arranged interlacedly with the first slots 1222c in the outermost circle.

In an embodiment, the first slots 1222c and the second slots 1224c are designed in a symmetric way respectively, such as the four second slots 1224c with long strip shapes are placed on the four corners of the elastic portion 122c and the second slots 1224c are parallel to each other. The widths of the first slots 1222c and the second slots 1224c are the same. The shape of the first slots 1222c and the second slots 1224c is but not limited to a straight strip, T shape, C shape, zigzag shape, or any other possible shape. The embodiment is for illustrating but not for limiting the present invention. According to the design, the coefficient of elasticity of the MEMS microphone thin film 12c is controlled effectively and the firmness of the MEMS microphone thin film 12c is ensured, so that a high sensitivity for the voice variation is obtained. In addition, the MEMS microphone device has greater force tolerance for the liquid flow during the process of wet etching.

Figure 2D:
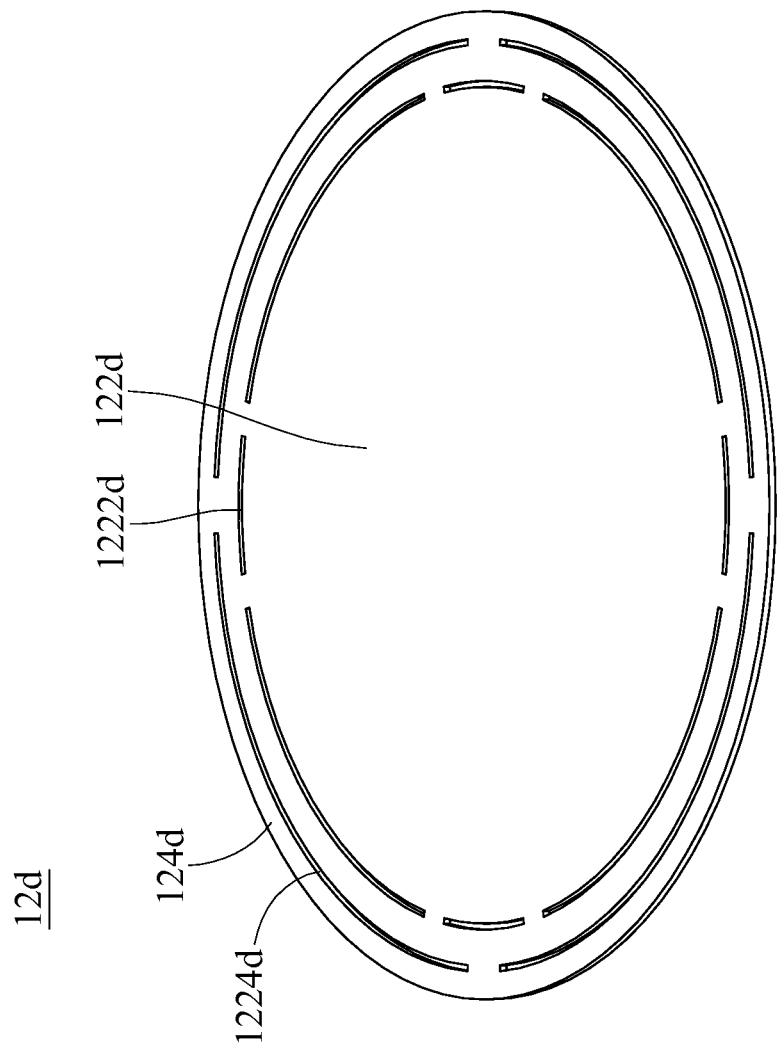
FIG. 2D is yet another further 3D diagram of the MEMS microphone device according to an embodiment of the present invention.

In the previous embodiment, the shape of the MEMS microphone thin film 12c in FIG. 2C is a rectangle. However, the embodiment is for illustrating but not for limiting the present invention. As shown in FIG. 2D, the shape of the MEMS microphone thin film 12 is a circle. FIG. 2D is yet another further 3D diagram of the MEMS microphone device according to an embodiment of the present invention. The difference between the MEMS microphone thin film 12d in FIG. 2D and the MEMS microphone thin film 12c in FIG. 2C are the shapes and the design of the slot. In FIG. 2D, the MEMS microphone thin film 12d still includes the elastic portion 122d and the connection portion 124d. The elastic portion 122d has a plurality of slots with different length. The shorter slots are the first slots 1222d, and the longer slots are the second slots 1224d. The first slots 1222d and the second slots 1224d surround the elastic portion 122d in multi-layer. The first slots 1222d and the second slots 1224d are designed in a symmetric way respectively, such as the four curved first slots 1222d and the second slots 1224d are arranged interlacedly, and each of the second slots 1224d has equal length, and the widths of the first slots 1222d and the second slots 1224d are the same. The shape of the first slots 1222d and the second slots 1224d is but not limited to a T shape, C shape, zigzag shape, or any other possible shape. The embodiment is for illustrating but not for limiting the present invention. The MEMS microphone thin film 12d in FIG. 2D still has the same effect as the MEMS microphone thin film 12c in FIG. 2C.

Please refer to FIG. 1 continuously. The oxide layer 14 has a second penetrating portion 142. The oxide layer 14 is on the substrate 10 and the oxide layer 14 contacts the connection portion. From the top view, the MEMS microphone thin film 12 is exposed through the structure of the second penetrating portion 142. In the present embodiment, the second penetrating portion 142 is manufactured by the CMOS process and the CMOS process is, for example, wet etching. After the second penetrating portion 142 is formed, from the cross sectional diagram, the second penetrating portion 151 splits the oxide layer 14 into two parts, that is, the left part and the right part. In other words, the second penetrating portion 142 is approximately located in the center of the oxide layer 14. In addition, from the top view, the second penetrating portion 142 is but not limited to a circle, a rectangle, a polygon, or any other geometric shape. Besides, whether the second penetrating portion 142 splits the oxide layer 14 practically and forms two or more sub oxide layers is not limited by the embodiment. For example, from the top view, when the second penetrating portion 142 splits the oxide layer 14, the sub oxide layers are on the substrate 10 apart. In addition, the connection portion of the MEMS microphone thin film 12 is fixed in the oxide layer 14 and splits the lower first penetrating portion 102 and the upper second penetrating portion 142.

The backplane layer 16 has a plurality of gaps 160. The backplane layer 16 contacts the oxide layer 14. In the present embodiment, the backplane layer 16 is in the oxide layer 14. From the top view, part of the MEMS microphone thin film 12 is exposed through the plurality of gaps 160 and the second penetrating portion 142. In the present embodiment, the plurality of gaps 160 are manufactured by the CMOS process and the CMOS process is, for example, wet etching. The blocker 18 is between the MEMS microphone thin film 12 and the backplane layer 16. The blocker 18 is connected with the oxide layer 14 and is located in the second penetrating portion 142. The passivation layer 20 is on the oxide layer 14, and the passivation layer 20 does not completely covers the upper surface of the oxide layer 14. In other words, from the top view, part of the backplane layer 16 is revealed through the passivation layer 20. In an embodiment, the blocker 18 is a single ring structure in the oxide layer 14, or a plurality of blockers 18 are designed to be placed in the oxide layer 14 apart. The previous embodiments are for illustrating but not for limiting the present invention.

In the present embodiment, the backplane layer 16, the blocker 18, the passivation layer 20 are manufactured by the CMOS process and the CMOS process is, for example, wet etching. It is worth mentioning that the backplane layer 16, the blocker 18, and the passivation layer 20 are not necessary structures. The complete function of the MEMS microphone device 1 is still embodied when the MEMS microphone device 1 does not have the backplane layer 16, the blocker 18, or the passivation layer 20.

Figure 3:
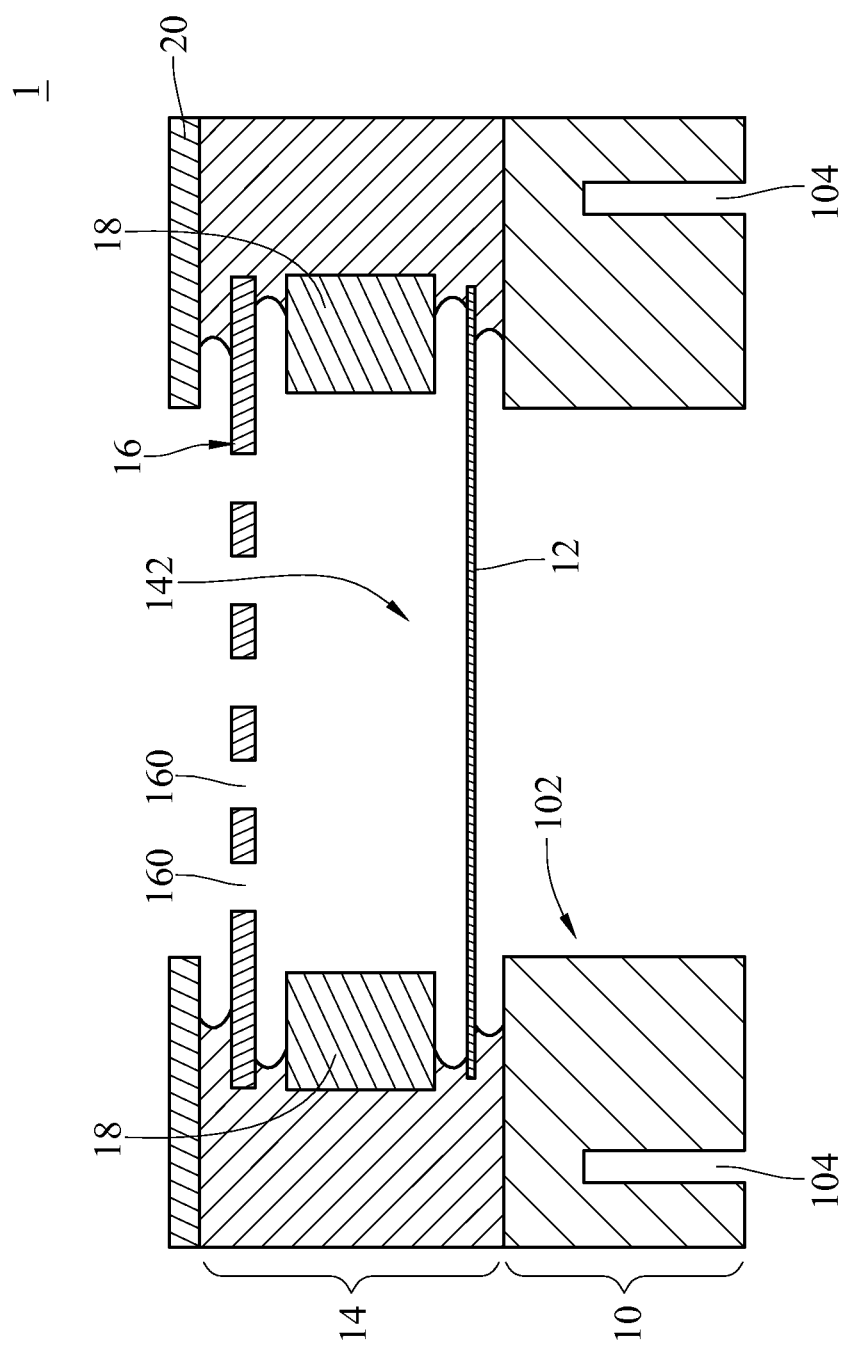
FIG. 3 is another cross sectional diagram of the MEMS microphone device according to an embodiment of the present invention.

In an embodiment, the substrate 10 has a special design to reinforce the strength of the structure. Please refer to FIG. 3. FIG. 3 is another cross sectional diagram of the MEMS microphone device according to an embodiment of the present invention. As shown in FIG. 3, the substrate 10 has at least one recess portion 104, and the open part of the recess portion 104 is on the bottom surface of the substrate 10, and the recess portion 104 surrounds the first penetrating portion 102, wherein the bottom surface of the substrate 10 is the other surface opposite to the surface of the oxide layer 14. For example, from the bottom view of the substrate 10, the recess portion 104 is located between the first penetrating portion 102 and the edge of the substrate 10, and the recess portion 104 is mutually connected with the first penetrating portion 102. The shape of the recess portion 104 is not in association with the shape of the first penetrating portion 102. For example, from the bottom view of the substrate 10, the shape of the first penetrating portion 102 is a circle, and the shape of the recess portion 104 is but not limited to a circle, a rectangle, a polygon, or other shape, as long as the recess portion 104 surrounds the first penetrating portion 102.

In another embodiment, the substrate 10 has a plurality of recess portions 104. Although the cross section diagram in this embodiment is the same as the diagram of the previous embodiment, however, from the bottom view of the substrate 10, the plurality of recess portions 104 are arranged along the edge of the substrate 10 separately, and the plurality of recess portions 104 are located between the first penetrating portion 102 and the edge of the substrate 10. The number and the relative relationship of the recess portion 104 are not limited by the present embodiment and are designed according to persons skilled in the art. No matter one or a plurality of recess portions 104 surround the first penetrating portion 102, the substrate 10 has the buffer characteristic similar to a spring by equipping the recess portion 104. Therefore, during the breaking process of the MEMS microphone device 1 on the silicon wafer, the expansion force stretching the substrate 10 from the left and right side is effectively reduced, so that impairments, wrinkles, and structure damages of the MEMS microphone thin film 12 are avoided and the yield rate of the MEMS microphone device 1 is enhanced.

Figure 4:
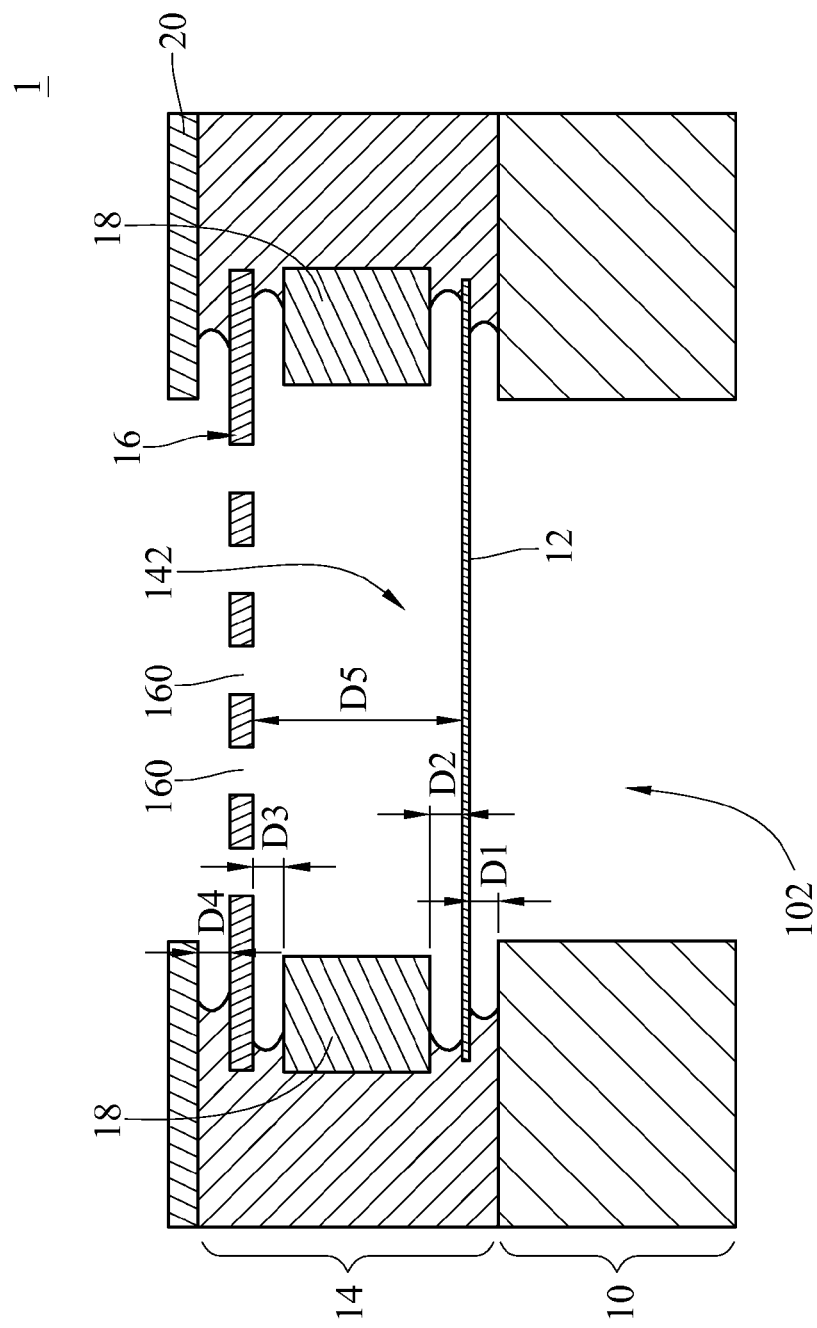
FIG. 4 is a cross sectional diagram of the distance relationship between the demonstration components of the MEMS microphone device according to an embodiment of the present invention.

In order to make persons skilled in the art understand the distance relationship of each component of the MEMS microphone device 1, please refer to FIG. 4. FIG. 4 is a cross sectional diagram of the distance relationship between the demonstration components of the MEMS microphone device according to an embodiment of the present invention. As shown in FIG. 4, a first distance D1 is between the MEMS microphone thin film 12 and the substrate 10, and a second distance D2 is between the MEMS microphone thin film 12 and the blocker 18, and a third distance D3 is between the blocker 18 and the backplane layer 16, and a fourth distance D4 is between the backplane layer 16 and the passivation layer 20. The first distance D1 is between 0.01 and 1 μm, such as 0.05 μm or 0.1 μm. The second distance D2 is between 0.01 and 1 μm, such as 0.5 or 0.8 μm. The third distance D3 is between 0.01 and 1 μm, such as 0.5 or 0.8 μm. The fourth distance D4 is between 0.01 and 1 μm, such as 0.3 or 0.5 μm. The length of the gap 160 of the backplane layer 16 is between 1 and 5 μm, such as 2.5 or 3 μm. In addition, there is a fifth distance D5 between the MEMS microphone thin film 12 and the backplane layer 16, and the fifth distance is between 1 and 5 μm, such as 2, 2.18, 2.5, or 3 μm. The width and length of the MEMS microphone thin film 12 are less than 350 μm. By the aforementioned configuration, when each penetrating portion and gap are formed in the MEMS microphone device 1 by wet etching, the stiction effect happened between the MEMS microphone thin film 12 and the backplane layer 16 is effectively avoided, and etching oxide layer 14 by the etchant is also avoided.

Figure 5:
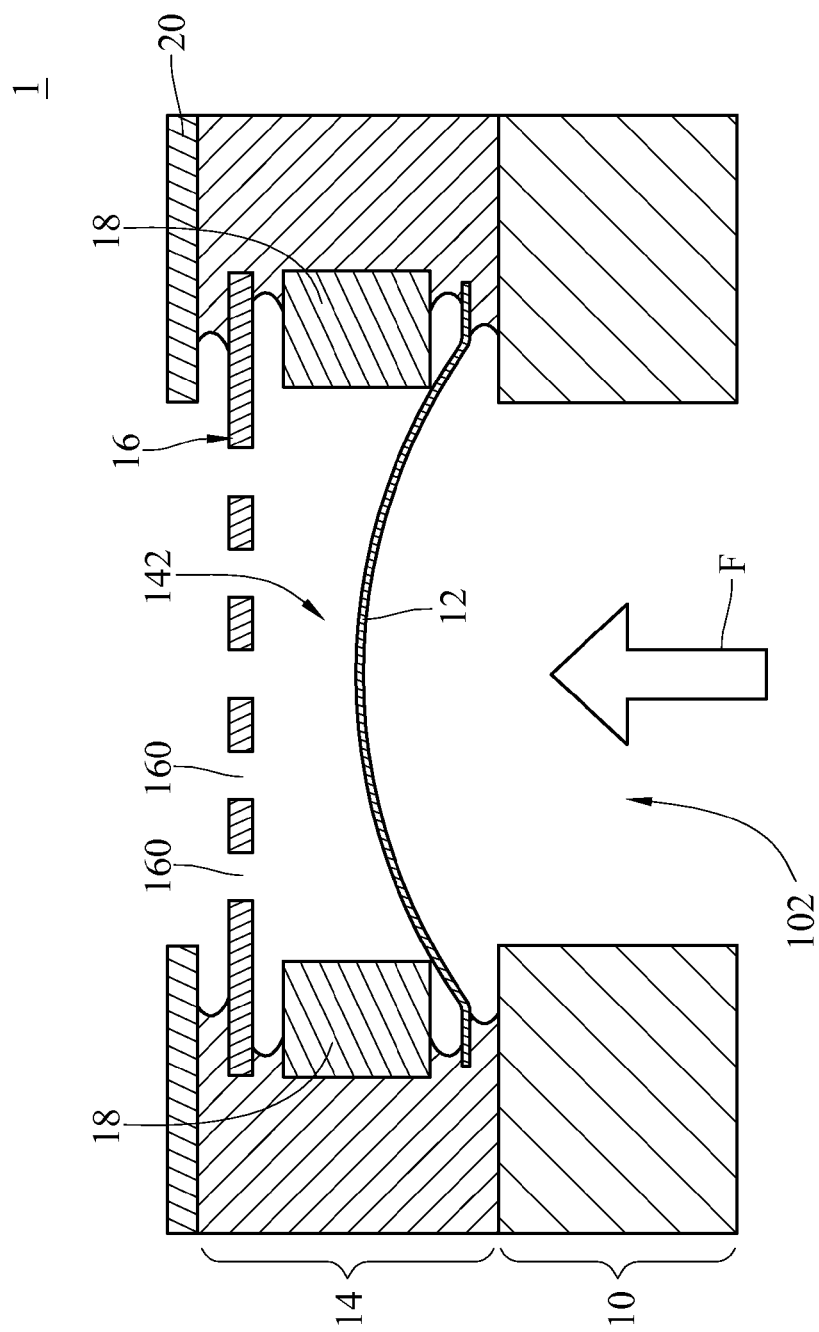
FIG. 5 is a cross sectional diagram of the MEMS microphone device during the operation according to an embodiment of the present invention.

In addition, when withstanding acoustic pressure, the MEMS microphone thin film 12, for example, elastic portion the in FIG. 4 vibrates up or down in a certain amount of displacement. Please refer to FIG. 5. FIG. 5 is a cross sectional diagram of the MEMS microphone device during the operation according to an embodiment of the present invention. As shown in FIG. 5, when the acoustic pressure F withstood by the MEMS microphone thin film 12 is greater than the default acoustic pressure of the MEMS microphone device 1, the short circuit created by the aforementioned contact and the damage of the MEMS microphone device 1 are avoided by blocking the contact of the MEMS microphone thin film 12 and the backplane layer 16 with the blocker 18.

The MEMS microphone device illustrated in an embodiment of the present invention has a plurality of first slots on the elastic portion of the MEMS microphone thin film and the plurality of first slots are arranged around the elastic portion. In addition, the elastic portion further has a plurality of second slots, and the plurality of first slots surround the plurality of second slots, and each of the plurality of second slots is adjacent to a first slot. Therefore, the coefficient of elasticity of the MEMS microphone thin film is controlled effectively and the firmness of the MEMS microphone thin film is ensured, so that a high sensitivity for the voice variation is obtained.

The foregoing description has been presented for purposes of illustration. It is not exhaustive and does not limit the invention to the precise forms or embodiments disclosed. Modifications and adaptations will be apparent to those skilled in the art from consideration of the specification and practice of the disclosed embodiments of the invention. It is intended, therefore, that the specification and examples be considered as exemplary only, with a true scope and spirit of the invention being indicated by the following claims and their full scope of equivalents.

What is claimed is:

1. A Micro Electro Mechanical System (MEMS) microphone device, comprising:
   a substrate having a first penetrating portion;
   a MEMS microphone thin film above the substrate, and covering the first penetrating portion and defining a first cavity, the MEMS microphone thin film comprising:
      an elastic portion defined in the center area of the MEMS microphone thin film; and a connection portion defined in the edge area of the MEMS microphone thin film and partially connected with the elastic portion, a plurality of first slots surrounding the elastic portion defined between the connection portion and the elastic portion; and an oxide layer having a second penetrating portion and connected with the connection portion of the MEMS microphone thin film, the second penetrating portion exposing at least part of the MEMS microphone thin film.

2. The device of claim 1, wherein the substrate has at least one recess portion and the recess portion surrounds the first penetrating portion.

3. The device of claim 2, further comprising:
a backplane layer on the oxide layer and having a plurality of gaps, wherein part of the MEMS microphone thin film is exposed by the plurality of gaps and the second penetrating portion.

4. The device of claim 3, further comprising:
at least one blocker, in the second penetrating portion, between the MEMS microphone thin film and the backplane layer, and connected with the oxide layer.

5. The device of claim 4, further comprising:
a passivation layer on the oxide layer, wherein part of the backplane layer is exposed by the oxide layer.

6. The device of claim 5, wherein there are a first distance between the MEMS microphone thin film and the substrate, a second distance between the MEMS microphone thin film and the blocker, a third distance between the blocker and the backplane layer, and a fourth distance between the backplane layer and the passivation layer, and the first distance, the second distance, the third distance and the fourth distance are not less than 0.01 micrometer ($\mu m$) and not greater than 0.1 $\mu m$.

7. The device of claim 3, wherein the length of each of the plurality of gaps of the backplane layer is 3 $\mu m$.

8. The device of claim 3, wherein there is a fifth distance between the MEMS microphone thin film and the backplane layer, and the fifth distance is not less than 1 and not greater than 3 $\mu m$.

9. The device of claim 2, wherein in a cross sectional plane parallel to an upper surface of the substrate and a lower surface of the substrate, an area of the recess portion is less than the area of the first penetrating portion.

10. The device of claim 1, wherein the substrate has a plurality of recess portions arranged along the edge of the substrate separately.

11. The device of claim 10, further comprising:
a backplane layer on the oxide layer and having a plurality of gaps, wherein part of the MEMS microphone thin film is exposed by the plurality of gaps and the second penetrating portion.

12. The device of claim 11, further comprising:
at least one blocker, in the second penetrating portion, between the MEMS microphone thin film and the backplane layer, and connected with the oxide layer.

13. The device of claim 12, further comprising:
a passivation layer on the oxide layer, wherein part of the backplane layer is exposed by the oxide layer.

14. The device of claim 13, wherein there are a first distance between the MEMS microphone thin film and the substrate, and a second distance between the MEMS microphone thin film and the blocker, and a third distance between the blocker and the backplane layer, and a fourth distance between the backplane layer and the passivation layer, and the first distance, the second distance, the third distance and the fourth distance are not less than 0.01 and not greater than 0.1 $\mu m$.

15. The device of claim 11, wherein the length of each of the plurality of gaps of the backplane layer is not less than 1 and not greater than 5 $\mu m$ respectively.

16. The device of claim 11, wherein there is a fifth distance between the MEMS microphone thin film and the backplane layer, and the fifth distance is not less than 1 and not greater than 5 $\mu m$.

17. The device of claim 1, wherein the thickness of the MEMS microphone thin film is less than 0.4 $\mu m$.

18. The device of claim 1, wherein the length and width of the MEMS microphone thin film is less than 350 $\mu m$.

19. The device of claim 1, wherein the ratio of the width of plurality of first slots to the width of the MEMS microphone thin film is at least less than 1:200.

20. The device of claim 1, wherein the shape of the MEMS microphone thin film is a circle or a rectangle.

21. The device of claim 1, wherein the elastic portion further has a plurality of second slots and a plurality of third slots, and the plurality of first slots surrounds the plurality of second slots and the plurality of third slots, and the plurality of second slots and the plurality of third slots are arranged interlacedly, and each of the plurality of second slots is close and parallel to each of the plurality of first slots respectively, and each of the plurality of third slots is between the two nearby second slots respectively, and the plurality of third slots are pairwisely symmetric and located in the diagonally opposite corners of the elastic portion.

22. The device of claim 21, wherein the shapes of the plurality of first slots, the plurality of second slots, and the plurality of third slots are straight strips.

* * * * *